US007480126B2

(12) United States Patent
Cetrulo et al.

(10) Patent No.: US 7,480,126 B2
(45) Date of Patent: Jan. 20, 2009

(54) PROTECTION AND VOLTAGE MONITORING CIRCUIT

(75) Inventors: Raffaele Cetrulo, Austin, TX (US); Mark Whittington, Austin, TX (US)

(73) Assignee: National Instruments Corporation, Austin, TX (US)

( * ) Notice: Subject to any disclaimer, the term of this patent is extended or adjusted under 35 U.S.C. 154(b) by 271 days.

(21) Appl. No.: 11/115,773

(22) Filed: Apr. 27, 2005

(65) Prior Publication Data

US 2006/0245133 A1 Nov. 2, 2006

(51) Int. Cl.
H02H 3/20 (2006.01)
(52) U.S. Cl. .................. 361/91.1; 361/93.9
(58) Field of Classification Search ........... 361/91.1, 361/93.9
See application file for complete search history.

(56) References Cited

U.S. PATENT DOCUMENTS

| | | | | |
|---|---|---|---|---|
| 3,215,859 A | * | 11/1965 | Sorchych | 327/427 |
| 3,532,899 A | * | 10/1970 | Wolterman et al. | 327/389 |
| 4,216,435 A | * | 8/1980 | Ahmed | 330/254 |
| 4,290,024 A | | 9/1981 | Yokoyama | |
| 4,390,790 A | * | 6/1983 | Rodriguez | 250/551 |
| 4,429,339 A | * | 1/1984 | Jaeschke et al. | 361/93.7 |
| 4,477,742 A | * | 10/1984 | Janutka | 327/436 |
| 4,484,257 A | * | 11/1984 | Sugimoto | 363/124 |
| 4,494,064 A | * | 1/1985 | Harkness | 323/277 |
| 4,665,316 A | * | 5/1987 | Hodges | 250/551 |
| 4,675,594 A | | 6/1987 | Reinke | |
| 4,691,262 A | * | 9/1987 | Chalfin | 361/56 |
| 4,931,715 A | * | 6/1990 | Lee et al. | 318/709 |
| 4,961,046 A | | 10/1990 | De Jager | |
| 5,552,729 A | | 9/1996 | Deguchi | |
| 5,552,730 A | | 9/1996 | Deguchi | |
| 5,569,550 A | * | 10/1996 | Garrett et al. | 429/7 |
| 5,598,117 A | | 1/1997 | Deguchi | |
| 5,610,505 A | | 3/1997 | Bernardson et al. | |

(Continued)

OTHER PUBLICATIONS

JP 05036332 A, Kawakita, Katsumi, Switch Operation Control Circuit, Feb. 12, 1993, English Translation of Abstract and Japanese Patent.*

(Continued)

*Primary Examiner*—Michael J Sherry
*Assistant Examiner*—Nicholas Ieva
(74) *Attorney, Agent, or Firm*—Meyertons Hood Kivlin Kowert & Goetzel, P.C.; Jeffrey C. Hood (57) ABSTRACT

A protection and voltage monitoring circuit that may provide the functionality of a diode without the typical large voltage drop and power dissipation. The protection and voltage monitoring circuit may include a first MOSFET, a second MOSFET, a first resistor, an input terminal, an output terminal, a diode, a BJT current source, and a voltage monitoring circuit. The BJT current source may limit a gate-to-source voltage of the two MOSFETs to a predetermined voltage that is less than a maximum allowed voltage by controlling a current flow through the first resistor to prevent damage to the MOSFETs. The voltage monitoring circuit may determine whether an external voltage is within an allowable range of voltages. If the external voltage is outside the predetermined voltage range, the voltage monitoring circuit turns off the BJT current source to block the external voltage from the output terminal of the protection and voltage monitoring circuit.

23 Claims, 5 Drawing Sheets

U.S. PATENT DOCUMENTS

| | | | |
|---|---|---|---|
| 5,619,125 A | 4/1997 | Lakshmikumar | |
| 5,917,368 A | 6/1999 | Tan et al. | |
| 5,994,744 A * | 11/1999 | Katayama et al. | 257/370 |
| 6,043,636 A * | 3/2000 | Gaudreau et al. | 323/282 |
| 6,219,261 B1 | 4/2001 | Stochino | |
| 6,225,992 B1 * | 5/2001 | Hsu et al. | 345/211 |
| 6,331,763 B1 * | 12/2001 | Thomas et al. | 320/136 |
| 6,424,035 B1 * | 7/2002 | Sapp et al. | 257/723 |
| 6,608,445 B2 * | 8/2003 | Melvin et al. | 315/82 |
| 6,693,812 B1 * | 2/2004 | Li et al. | 363/97 |
| 2002/0130645 A1 * | 9/2002 | Tsai et al. | 323/274 |
| 2003/0038842 A1 * | 2/2003 | Peck et al. | 345/763 |

OTHER PUBLICATIONS

Thomas M. Frederiksen, "Intuitive Operational Amplfiers: From Basics to Useful Applications", McGraw-Hill, New York, NY 1988, 214-215.

* cited by examiner

PROTECTION AND VOLTAGE MONITORING CIRCUIT

BACKGROUND OF THE INVENTION

1. Field of the Invention

The present invention relates generally to measurement and instrumentation systems and, more specifically, to a protection and voltage monitoring circuit.

2. Description of the Related Art

Scientists and engineers often use measurement systems to perform a variety of functions, including measurement of a physical phenomena or unit under test (UUT), test and analysis of physical phenomena, process monitoring and control, control of mechanical or electrical machinery, data logging, laboratory research, and analytical chemistry, to name a few examples.

A typical measurement system comprises a computer system with a measurement device or measurement hardware. The measurement device may be a computer-based instrument, a data acquisition device or board, a programmable logic device (PLD), an actuator, or other type of device for acquiring or generating data. The measurement device may be a board or module plugged into one of the I/O slots of the computer system, or a board or module plugged into a chassis, or an external device. Generally, the computer system has an I/O bus and connectors or slots for receiving I/O boards. Various computer systems and I/O buses may be used to implement a processing system for receiving the measurements. The computer may receive measurements from multiple sources, where, for example, different sources may interface with the computer through respective input and output measurement modules.

A measurement system may typically include transducers, sensors, or other detecting means for providing "field" electrical signals representing a process, physical phenomena, equipment being monitored or measured, etc. The field signals are provided to the measurement hardware. In addition, a measurement system may also typically include actuators for generating output signals for stimulating a UUT.

Measurement systems, which may also be generally referred to as data acquisition systems, may include the process of converting a physical phenomenon (such as temperature or pressure) into an electrical signal and measuring the signal in order to extract information. PC-based measurement and data acquisition (DAQ) systems and plug-in boards are used in a wide range of applications in the laboratory, in the field, and on the manufacturing plant floor.

In a measurement or data acquisition process, analog signals may be received by a digitizer, which may reside in an analog input module of a DAQ system. The analog signals may be received from a sensor, converted to digital data (possibly after being conditioned) by an analog-to-digital converter (ADC), and transmitted to a computer system for storage and/or analysis. In addition, the computer system may generate digital signals that are provided to one or more digital to analog converters (DACs) in an analog output module of the DAQ system. The DACs convert the digital signal to an analog output signal that is used, e.g., to stimulate a UUT.

SUMMARY OF THE INVENTION

Various embodiments of a protection and voltage monitoring circuit are disclosed. In one embodiment, the protection and voltage monitoring circuit may be included in a measurement module of a measurement and data acquisition system. The protection and voltage monitoring circuit may provide the functionality of a diode without the large voltage drop and power dissipation. The protection and voltage monitoring circuit may include a first metal-oxide semiconductor field-effect transistor (MOSFET), a second MOSFET, a first resistor, an input terminal, an output terminal, a diode, a first bipolar junction transistor (BJT), a second BJT, a second resistor, a third resistor, a power supply terminal, and a voltage monitoring circuit.

In one embodiment, the input terminal of the protection and voltage monitoring circuit may receive an external voltage ($V_{EXT}$). Each of the first and second MOSFETs may include a gate terminal, a drain terminal, and a source terminal, and each of the first and second BJTs may include a base terminal, an emitter terminal, and a collector terminal. The drain terminal of the first MOSFET may be coupled to the input terminal of the protection and voltage monitoring circuit, and the drain terminal of the second MOSFET may be coupled to the output terminal of the protection and voltage monitoring circuit. The gate terminal of the first MOSFET may be connected to the gate terminal of the second MOSFET, and the source terminal of the first MOSFET may be connected to the source terminal of the second MOSFET. In addition, the first resistor may be connected between a junction of the source terminals of the first and second MOSFETs and a junction of the gate terminals of the first and second MOSFETs. The collector terminal of the first BJT may be coupled to the junction of the gate terminals of the first and second MOSFETs and to the first resistor. The collector terminal of the second BJT may be coupled to a junction of the base terminal of the first BJT and the second resistor, and the second resistor may be coupled to the power supply terminal. Also, the base terminal of the second BJT may be coupled to a junction of the emitter terminal of the first BJT and the third resistor. The emitter terminal of the second BJT may be coupled to a junction of the third resistor and the voltage monitoring circuit.

In one embodiment, the first and second BJTs, the first and second resistors, and the power supply terminal may function as a current source. The current source may limit a gate-to-source voltage of the first and second MOSFETs to a predetermined voltage value that is less than a maximum allowed voltage value to prevent damage to the first and second MOSFETs. The current source may limit a gate-to-source voltage by controlling a current flow through the first resistor.

In one embodiment, the protection and voltage monitoring circuit may be coupled to a device such as a power supply. The protection and voltage monitoring circuit may be designed to function like a switch and protect the power supply from an external voltage ($V_{EXT}$) that is outside the allowable range of voltages. In one example, as described above, the power supply may be configured to receive an external voltage that is within the range of between 9 and 36 VDC and convert that voltage to 13.5VDC. The voltage monitoring circuit may determine whether the external voltage is within a predetermined voltage range, e.g., the allowable range of voltages. If the external voltage is within the predetermined voltage range, the voltage monitoring circuit turns on the current source to establish a conduction path between the input terminal and the output terminal of the protection circuit. If the external voltage is outside the predetermined voltage range, the voltage monitoring circuit turns off the current source to block the external voltage from the output terminal of the protection circuit.

BRIEF DESCRIPTION OF THE DRAWINGS

A better understanding of the present invention may be obtained when the following detailed description is considered in conjunction with the following drawings, in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must). The term "include", and derivations thereof, mean "including, but not limited to". The term "coupled" means "directly or indirectly connected".

DETAILED DESCRIPTION

U.S. patent application Ser. No. 10/195,051 and Publication No. 2003/0074489 titled "Measurement System with Modular Measurement Modules That Convey Interface Information" filed on Jul. 12, 2002 whose inventors are Perry Steger, Garritt W. Foote, David Potter, and James J. Truchard is hereby incorporated by reference in its entirety as though fully and completely set forth herein.

Measurement System

Figure 1:
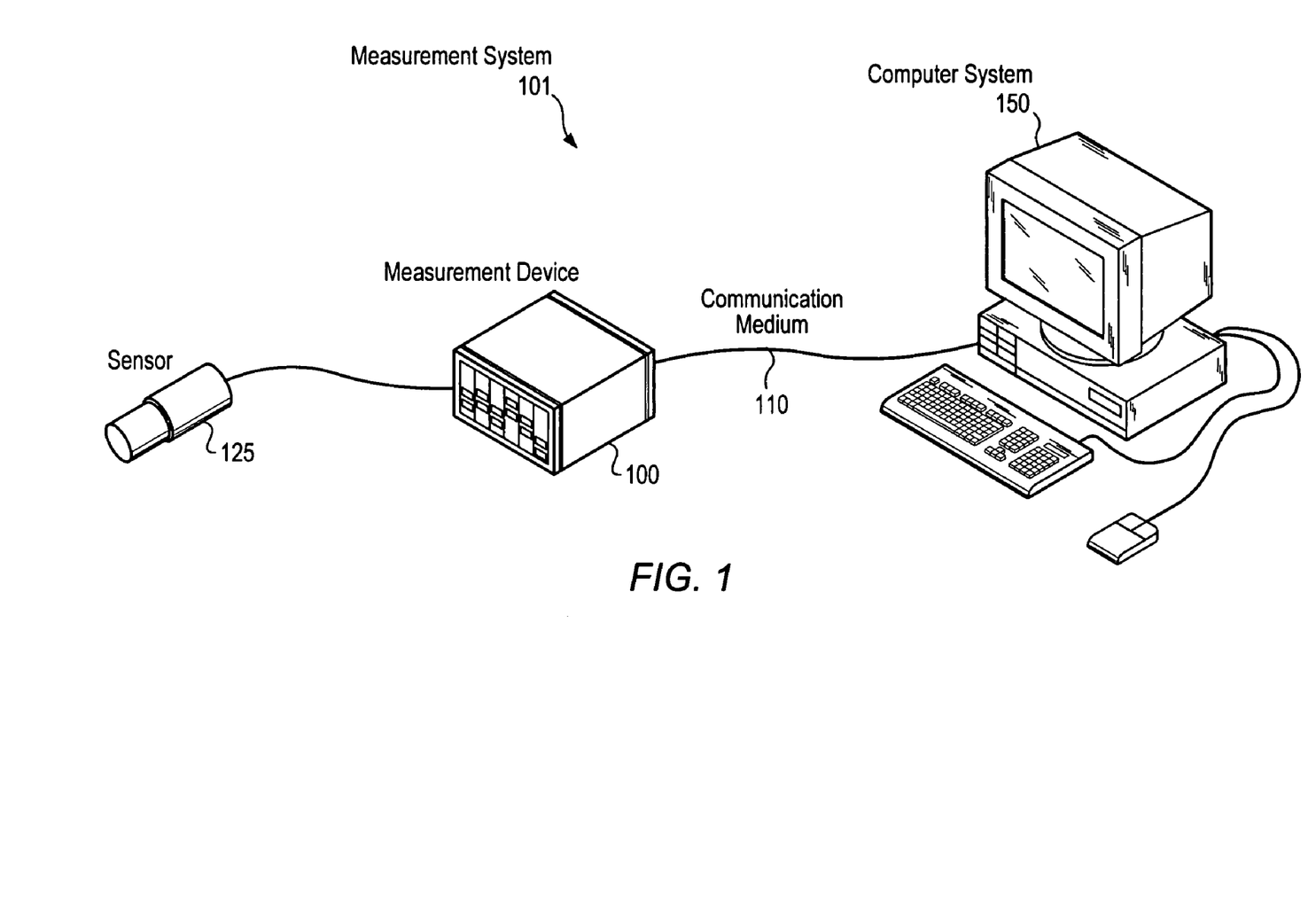
FIG. 1 is a diagram of one embodiment of a computer-based measurement or data acquisition system.

FIG. 1 is a diagram of one embodiment of a computer-based measurement or data acquisition system 101. The measurement system 101 may include a computer system 150 (e.g., a host computer) coupled to a measurement device or data acquisition device 100. In one embodiment, the measurement device 100 may include a carrier and one or more measurement modules. As used herein, the term "measurement device" is intended to include any of various types of devices that are operable to acquire, generate, and/or store data, which may optionally be further operable to analyze or process the acquired or stored data. Examples of a measurement device include various types of instruments, such as oscilloscopes, multimeters, data acquisition devices or cards, devices external to a computer that operate similarly to a data acquisition cards, smart sensors, one or more DAQ or input measurement modules in a chassis, and other similar types of devices.

The measurement device 100 may in turn couple to or comprise a sensor or actuator 125, such as a pressure or temperature sensor, a thermocouple, an imaging device, (e.g. a camera), or any other type of sensor or actuator. In one example, the sensor 125 may be a temperature sensor, which is comprised in a unit under test (UUT). In this example, the measurement device 100 may receive a temperature reading from the temperature sensor and convert the analog data to digital form to be sent to the computer system 150 for analysis. In another example, the computer system 150 may send data to the measurement device 100 for various purposes, such as for use in generating analog signals used for stimulating the sensor 125 and/or the UUT.

The computer system 150 may couple to the measurement device 100 through a serial bus, such as a USB (Universal Serial Bus), or any other communication medium 110 including Ethernet, wireless media such as IEEE 802.11 (Wireless Ethernet), a network such as a Control Area Network (CAN) or the Internet, serial or parallel buses, or any other transmission means. The computer system 150 may comprise a CPU, a display screen, memory, and one or more input devices such as a mouse or keyboard. The computer system 150 may operate with the measurement device 100 to analyze or measure data from the sensor 125 and/or measurement device 100 or to control the sensor 125 and/or measurement device 100.

The computer system 150 may include a processor, which may be any of various types, including an x86 processor, e.g., a Pentium™ class, a PowerPC™ processor, a CPU from the SPARC™ family of RISC processors, as well as others. Also, the computer system 150 may also include one or more memory subsystems (e.g., Dynamic Random Access Memory (DRAM) devices). The memory subsystems may collectively form the main memory of computer system 150 from which programs primarily execute. The main memory may be operable to store a user application and a driver software program. The user application may be executable by the processor to conduct the data acquisition/generation process. The driver software program may be executable by the processor to receive data acquisition/generation tasks from the user application and program the measurement device 100 accordingly.

Measurement Device

Figure 2:
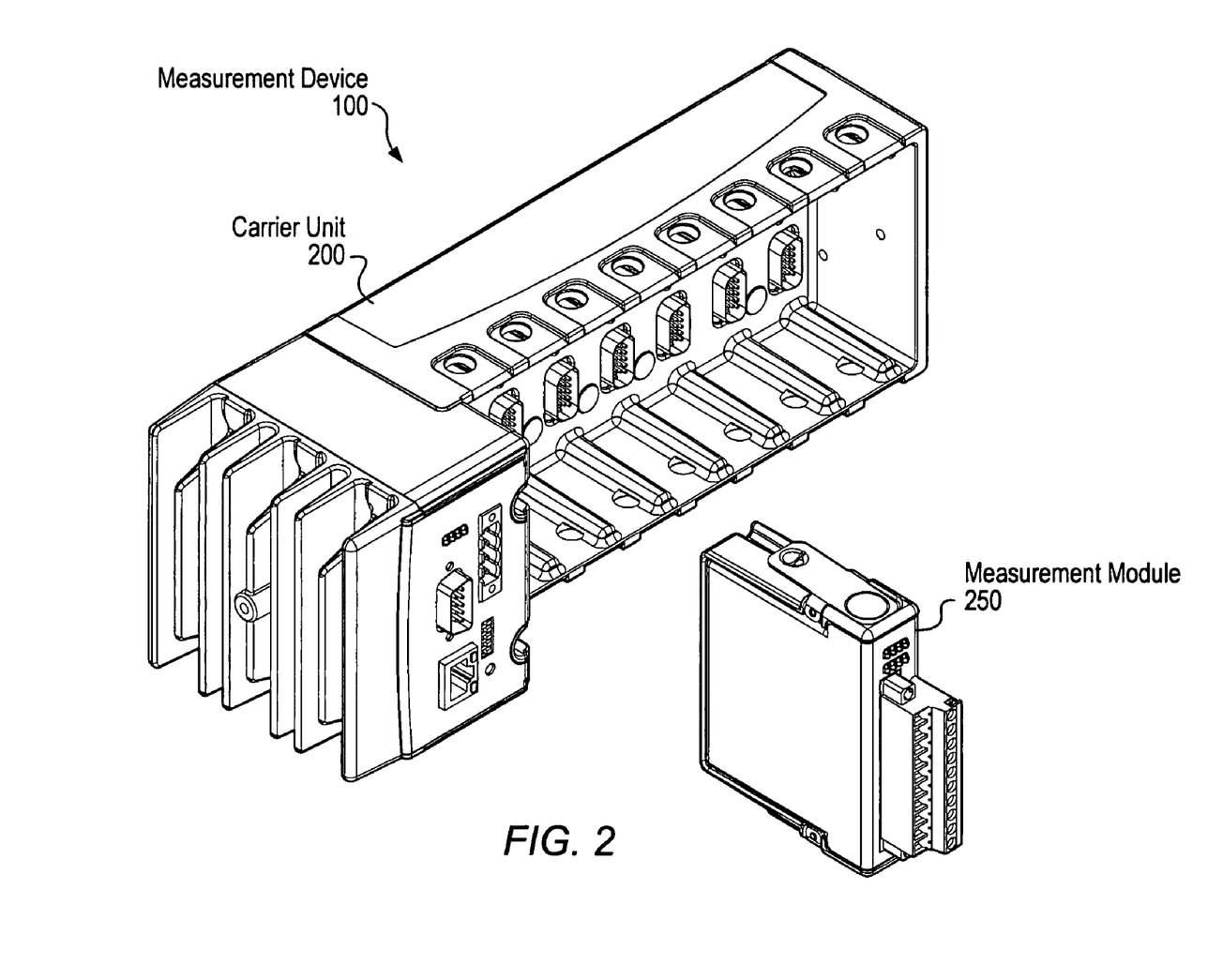
FIG. 2 is an isometric view of one embodiment of a measurement device including a carrier unit and one or more measurement modules.

FIG. 2 is an isometric view of one embodiment of a measurement device 100 including a carrier unit 200 and one or more measurement modules 250. As described above, the measurement device 100 may be included in the measurement and data acquisition system 101 of FIG. 1. The carrier unit 200 is operable to receive interface protocol information from the measurement module 250 specifying how to operate or interface with the measurement module 250. In one embodiment, the carrier unit 200 may then communicate the interface protocol information to the corresponding computer system, e.g., computer system 150 of FIG. 1. Alternatively, the measurement module 250 may communicate the interface protocol information directly to the computer system. Based on the interface protocol information, the computer system may program or configure the carrier unit 200 to implement the interface as specified by the measurement module 250. In other words, the measurement module 250 may tell the carrier 200 how to "talk" with it, and the carrier 200 may then tell the computer system how to program the carrier 200 to communicate with the measurement module 250 accordingly (or the measurement module 250 may tell the computer system directly how to program the carrier 200). The computer system may then program the carrier 200, thereby implementing the interface specified in the interface protocol information communicated by the measurement module 250. This process may be referred to as initialization of the measurement module/carrier. The configured carrier 200 and the measurement module 250 may then be operable to perform measurement and data acquisition operations using the sensor and/or the computer system.

In one embodiment, the measurement module 250 may be in the form of a measurement cartridge and the carrier 200 in the form of a cartridge carrier which is operable to receive one or more of the measurement cartridges. For example, the carrier unit 200 may comprise a chassis, a backplane comprised in the chassis providing for electrical communication, and one or more slots comprised in the chassis. Each of the one or more slots may include a connector that is coupled to the backplane, where each of the one or more slots may be adapted for receiving a measurement module 250. Thus, the carrier 200 may host a plurality of measurement cartridges, each of which may provide measurement and/or control functionality for a measurement or control operation or task. The carrier 200 may be operable to communicate with each measurement cartridge (i.e., module) and be programmed or configured (e.g., by the computer system or by a processor on the carrier 200) to implement the respective interface of each measurement cartridge. In this manner a suite of sensors may be fielded, each of which feeds signals to a respective measurement cartridge which in turn communicates through a respective interface (protocol) with the cartridge carrier. The cartridge carrier may in turn couple to a computer system. Thus, the carrier 200 may support a heterogeneous plurality of interfaces without having to include a heterogeneous set of interface hardware components.

The measurement modules 250 (or cartridges) may be easily removed, added, and replaced. In other words, measurement modules 250 may be exchanged to change the configuration or capabilities of the measurement system, e.g., measurement system 101. In one embodiment, the measurement module 250 may be replaced without powering down the measurement system, i.e., the measurement module 250 may be "hot-plugged" into the carrier 200, where the measurement module 250 may communicate the interface protocol information to the carrier 200 upon attachment, and the carrier 200 is programmed in response, as described above. In another embodiment, the measurement module 250 and/or carrier 200 may require a reboot or reset after attachment to perform the described initialization. Thus, the interface circuitry (i.e., the measurement module 250) may be operable to communicate the interface protocol to the carrier unit 200 upon one or more of attachment of the measurement module 250 to the carrier unit 200, reset of the measurement module 250, reset of the carrier unit 200, reboot of the measurement module 250, and reboot of the carrier unit 200.

In one embodiment, the carrier unit 200 may be a reconfigurable I/O (RIO) carrier which may be configured to receive one or more RIO measurement modules (e.g., module 250). As used herein, the term "RIO" carrier refers to a carrier which includes reconfigurable hardware which is configurable with respective interface protocols for one or more measurement modules. In other words, a RIO carrier with multiple module slots may be configured with multiple interfaces for inserted measurement modules, such that each module's interface is implemented by the RIO carrier. For example, if three RIO modules with three different respective interfaces are inserted in three slots of the RIO carrier, then the RIO carrier may be configured to implement the three interfaces. Similarly, if multiple modules are sequentially inserted into and removed from a particular slot, the RIO carrier may be configured respectively for each module, i.e., sequentially. The RIO carrier may further be operable to couple to any of various products or platforms.

Measurement Module

Figure 3:
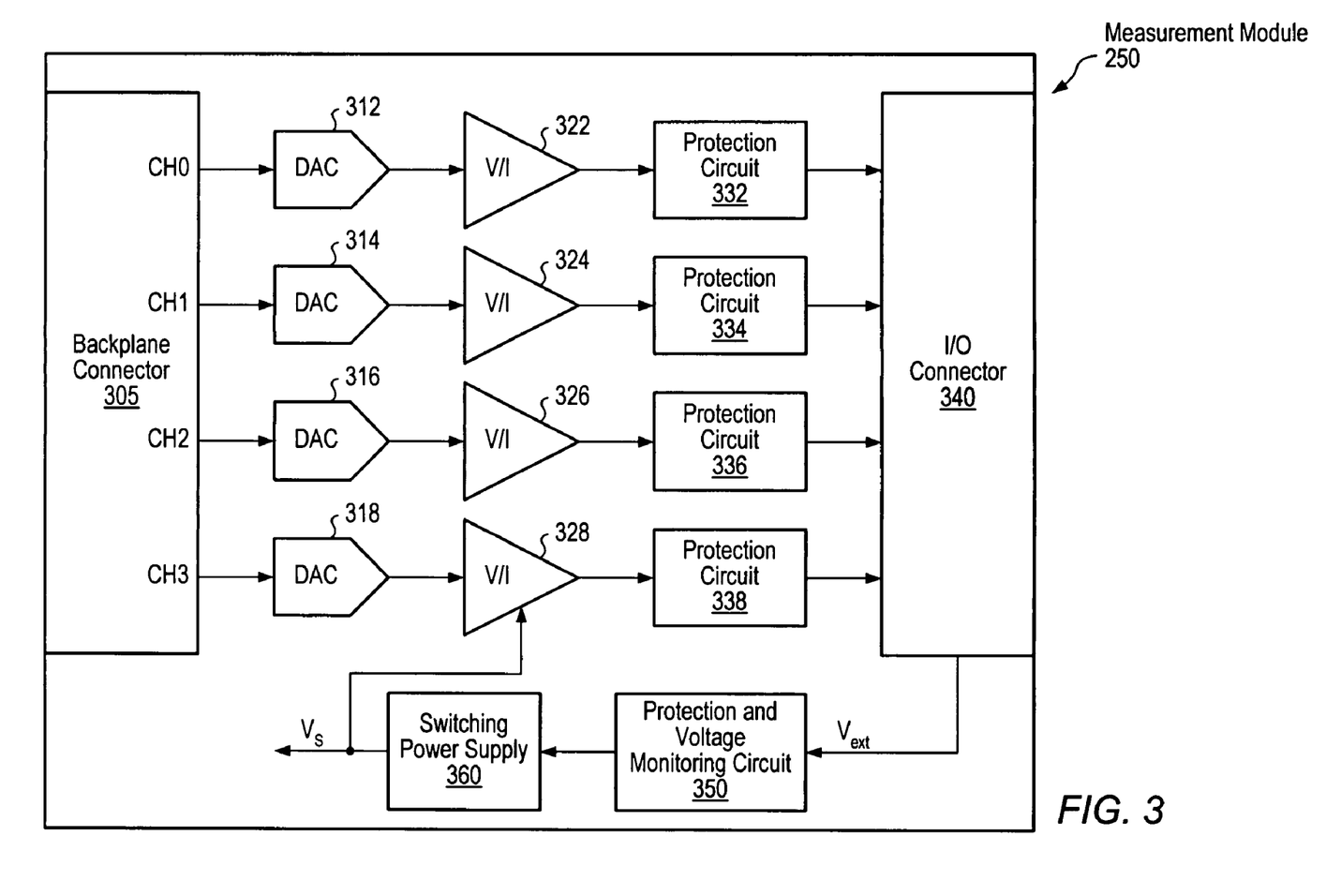
FIG. 3 is a block diagram of one embodiment of a measurement module including a protection and voltage monitoring circuit.

FIG. 3 is a block diagram of one embodiment of a measurement module 250 including a protection and voltage monitoring circuit 350. As described above, the measurement module 250 may be removably received in a carrier, e.g., carrier 200 of FIG. 2, and the measurement module 250 may be a RIO measurement module. Components that correspond to those shown in FIG. 1 and FIG. 2 are numbered identically for simplicity and clarity.

In one embodiment, the measurement module 250 may be four channel (e.g., CH0-CH4) analog output module including a backplane connector 305, a plurality of digital-to-analog converters (DACs) 312, 314, 316, and 318, a plurality of voltage-to-current (V/I) converters 322, 324, 326, and 328, a plurality of protection circuits 332, 334, 336, and 338, an input/output (I/O) connector, a protection and voltage monitoring circuit 350, and a switching power supply 360. The backplane connector 305 may be coupled to the DACs 312, 314, 316, and 318, which may be connected to the V/I converters 322, 324, 326, and 328. The protection circuits 332, 334, 336, and 338 may be connected between the V/I converters and the I/O connector 340. Also, the protection and voltage monitoring circuit 350 may be connected between the I/O connecter 340 and the switching power supply 360.

The backplane connector 305 may connect, e.g., to the backplane of the carrier unit 200 shown in FIG. 2. The backplane connector 305 may receive digital signals from the computer system (e.g., computer system 150 of FIG. 1) via the carrier unit 200 to be provided to the DACs (e.g., DAC 312). The DACs may convert the received digital signals to analog form. In one embodiment, the digital signals may need to be converted to analog form to stimulate the unit under test (UUT), which may be connected to the I/O connector 340.

The V/I converters (e.g., V/I converter 322) may receive a control voltage from the DACs and may generate an output current corresponding to the control voltage. Each of the V/I converters typically has very good DC rejection of the power supply (e.g., the switching power supply 360) because resistive networks (e.g., a first and second voltage dividers) included in each of the V/I converters are designed to have the same ratios. If the ratio corresponding to the first voltage divider is equal to the ratio corresponding to the second voltage divider, the output current of the V/I converter may be independent of the positive voltage rail ($V^s$) corresponding to the switching power supply 360 and may be dependent of the control voltage received from the corresponding DAC.

The protection circuits (e.g., protection circuit 332) may prevent over-voltage and over-current conditions in the measurement module 250, especially in the V/I converters (e.g., V/I converter 322). Therefore, the protection circuits may prevent damage to components of the measurement module 250.

The switching power supply 360 may be a high efficiency DC/DC converter, which may receive an external voltage $V_{EXT}$. The switching power supply 360 may reduce the internal power dissipation inside the measurement module 250 to the minimum amount possible based on the design and system requirements even if the measurement module 250 receives relatively high voltages from external voltage supplies. In one embodiment, the switching power supply 360 may comprise an internal SEPIC converter (Flyback-like topology) which converts an external voltage ($V_{EXT}$) of between 9 and 36 VDC to 13.5VDC (e.g., the positive supply rail $V_S$). It is noted however that in other embodiments the switching power supply 360 may be able to receive a wider range of voltages. It is also noted that in other embodiments the switching power supply 360 may convert the external voltage $V_{EXT}$ to other voltages depending on the system requirements.

The protection and voltage monitoring circuit 350 may be designed to function like a switch and protect the switching power supply 360 from an external voltage ($V_{EXT}$) that is outside the allowable range of voltages, as will be further described below with reference to FIGS. 4 and 5. In one example, as described above, the switching power supply 360 may be configured to receive an external voltage that is within the range of between 9 and 36 VDC. In one embodiment, the protection and voltage monitoring circuit 350 may include a MOSFET circuit, which may provide the functionality of a diode without the large voltage drop. Also, the protection and voltage monitoring circuit 350 may include a current source, which may limit a gate-to-source voltage of the MOSFETs to a given voltage value that is below a maximum allowed voltage value to prevent damage to the MOSFETs, as will be further described below with reference to FIGS. 4 and 5.

It should be noted that the components described with reference to FIG. 3 are meant to be exemplary only, and are not intended to limit the invention to any specific set of components or configurations. For example, in various embodiments, one or more of the components described may be omitted, combined, modified, or additional components included, as desired. For instance, in one embodiment, the measurement module 250 may include any number of channels, e.g., two or eight channels. Also, in one embodiment, the design of the switching power supply 360 and/or the protection circuits may vary.

Protection and Voltage Monitoring Circuit

Figure 4:
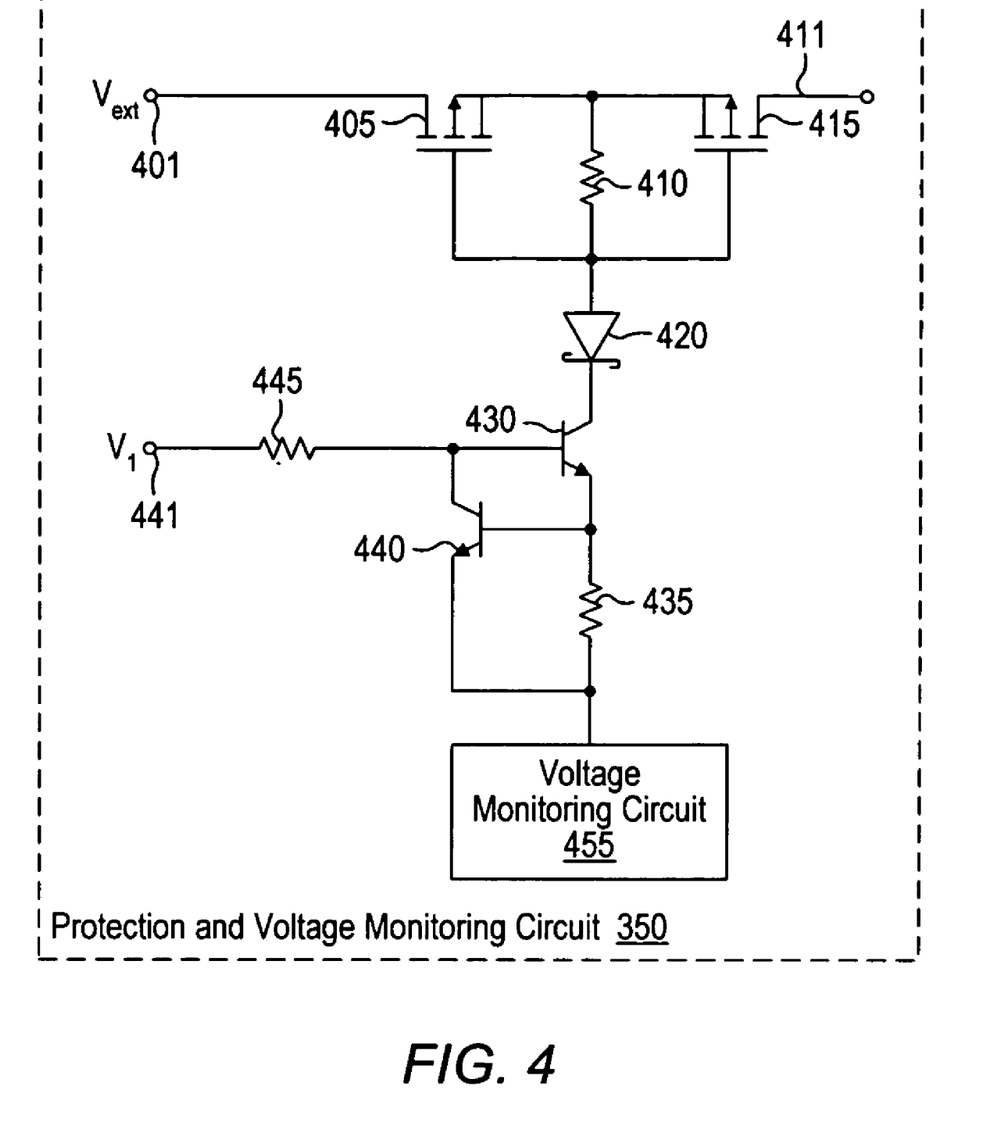
FIG. 4 is a block diagram of one embodiment of a protection and voltage monitoring circuit.

FIG. 4 is a block diagram of one embodiment of a protection and voltage monitoring circuit 350. Components that correspond to those shown in FIGS. 1-3 are numbered identically for simplicity and clarity. The protection and voltage monitoring circuit 350 may be an integrated circuit (IC), for example, an analog IC, which may be included in a measurement module, e.g., the measurement module 250 of FIG. 3. It is noted however that in other embodiments the protection and voltage monitoring circuit 350 may be included in other devices.

The protection and voltage monitoring circuit 350 may include a metal-oxide semiconductor field-effect transistor (MOSFET) 405, a MOSFET 415, a resistor 410, an input terminal 401, an output terminal 411, a diode 420, a bipolar junction transistor (BJT) 430, a BJT 440, a resistor 435, a resistor 445, a power supply terminal 441, and a voltage monitoring circuit 455. Each of the MOSFETs 405 and 415 includes a gate terminal, a drain terminal, and a source terminal, and each of the BJTs 430 and 440 includes a base terminal, an emitter terminal, and a collector terminal.

In one embodiment, the input terminal 401 of the protection and voltage monitoring circuit 350 may receive an external voltage ($V_{EXT}$). The drain terminal of the MOSFET 405 may be coupled to the input terminal 401 of the protection and voltage monitoring circuit 350, and the drain terminal of the MOSFET 415 may be coupled to the output terminal 411 of the protection and voltage monitoring circuit 350. The gate terminal of the MOSFET 405 may be connected to the gate terminal of the MOSFET 415, and the source terminal of the MOSFET 405 may be connected to the source terminal of the MOSFET 415. In addition, the resistor 410 may be connected between a junction of the source terminals of the MOSFETs 405 and 415 and a junction of the gate terminals of the MOSFETs 405 and 415. The collector terminal of the BJT 430 may be coupled to the junction of the gate terminals of the MOSFETs 405 and 415 and to resistor 410. The collector terminal of the BJT 440 may be coupled to a junction of the base terminal of the BJT 430 and the resistor 445, and the resistor 445 may be coupled to the power supply terminal 441. Also, the base terminal of the BJT 440 may be coupled to a junction of the emitter terminal of the BJT 430 and the resistor 435. The emitter terminal of the BJT 440 may be coupled to a junction of the resistor 435 and the voltage monitoring circuit 455. In one embodiment, as described above, the protection and voltage monitoring circuit 350 may be included within a measurement module (e.g., the measurement module 250 of FIG. 3) or other devices. In this embodiment, the power supply terminal 441 may be connected to an internal power supply ($V_1$) within the measurement module or device.

It should be noted that the components described with reference to FIG. 4 are meant to be exemplary only, and are not intended to limit the invention to any specific set of components or configurations. For example, in various embodiments, one or more of the components described may be omitted, combined, modified, or additional components included, as desired. For instance, in one embodiment the MOSFETs 405 and 415 may be replaced by other types of isolated-gate FETs (IGFETs) or by other types of transistors such as FETs or BJTs. Also, in some embodiments the number of resistors may vary, e.g., the resistor 410 may represent the combination of two resistors in series.

The MOSFETs 405 and 415 of the protection and voltage monitoring circuit 350 may provide the functionality of a diode without the large voltage drop and power dissipation. For example, in one embodiment, rather than a 700 mV voltage drop of a typical diode, the voltage drop of the MOSFET circuit may be only 40 mV at 200 mA of current. If the maximum allowed power dissipation is limited to 1.5 W, a typical diode would waste between 140 and 150 mW or 10% of the maximum allowed power dissipation, which would be unacceptable. It is noted however that the voltage drop of the MOSFET circuit and the maximum allowed power dissipation may vary depending at least on the components used in the design of protection and voltage monitoring circuit 350 and the requirements of the system.

When a positive external voltage $V_{EXT}$ is received, a parasitic diode corresponding to the MOSFET 405 may start to conduct, which may provide a current through the resistor 410 and turn on the MOSFET 405. Also, MOSFET 415, which may have the same gate-to-source voltage as MOSFET 405, will turn on and establish a channel of conduction between the input terminal 401 and the output terminal 411 of the protection and voltage monitoring circuit 350.

Typically, the gate-to-source voltage of MOSFETs (e.g., 405 and 415) may need to remain below a maximum voltage value for the MOSFETs to work properly and to prevent damage. Since the external voltage $V_{EXT}$ received at the input terminal 401 may be higher than this maximum voltage value, the protection and voltage monitoring circuit 350 may include a current source, which may limit the gate-to-source voltage of the MOSFETs to a given voltage value below the maximum voltage value to prevent damage to the MOSFETs. It is noted that the external voltage $V_{EXT}$ may be any voltage received from outside the protection and voltage monitoring circuit 350, e.g., the external voltage $V_{EXT}$ received by the measurement module 250 of FIG. 3 via the I/O connector 340.

In one embodiment, the BJT 430, the BJT 440, the resistor 435, the resistor 445, and the power supply terminal 441 may function as a current source to limit the gate-to-source voltage of the MOSFETs 405 and 415 to voltage value below the maximum allowed voltage value. Since the resistor 410 is connected between the gate and source of the MOSFETs, the gate-to-source voltage may be controlled by setting the resistor and current values appropriately. More specifically, the current source may limit the gate-to-source voltage of the MOSFETs 405 and 415 by including a resistor (i.e., resistor 410) with a particular resistance value in the circuit 350 and controlling the current flow through the resistor 410 when the circuit 350 is operational. For example, the gate-to-source voltage may be limited to 11V or 15V. It is noted however that the gate-to-source voltage may be limited to any value below the maximum allowed voltage value for the MOSFETs 405 and 415.

If the protection and voltage monitoring circuit 350 has no power applied to the control elements it may be off by design, therefore it may have the functionality of a switch. When the protection and voltage monitoring circuit 350 is off, it may look like two back-to-back diodes from the input terminal 401 due to the MOSFET circuit and the diode 420. Therefore, even without power, a negative supply (e.g., the external voltage $V_{EXT}$) at the input terminal 401 is blocked. Additionally, the protection and voltage monitoring circuit 350 may implement the switch functionality to protect a device (e.g., the switching power supply 360 of FIG. 3) from an external voltage $V_{EXT}$ that is outside the allowable range of voltages, as will be described further below.

Figure 5:
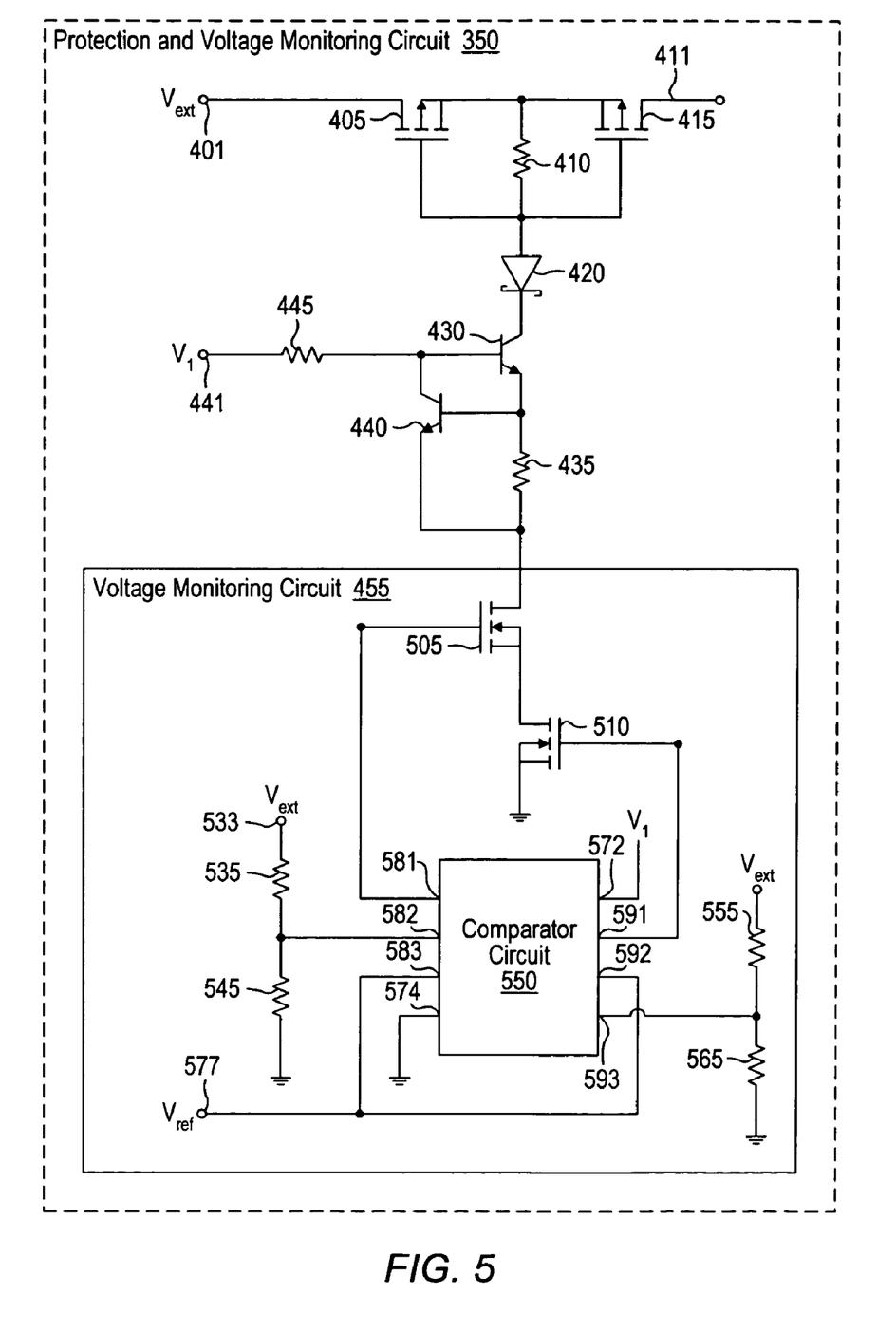
FIG. 5 is a block diagram of one embodiment of a voltage monitoring circuit included in the protection and voltage monitoring circuit.

FIG. 5 is a block diagram of one embodiment of the voltage monitoring circuit 455 included within the protection and voltage monitoring circuit 350. Components that correspond to those shown in FIGS. 1-4 are numbered identically for simplicity and clarity. The voltage monitoring circuit 455 may be included within the IC of the protection and voltage monitoring circuit 350. It is noted however that in other embodiments the voltage monitoring circuit 455 may be an integrated circuit (IC), which may be included in a measurement module, e.g., the measurement module 250 of FIG. 3.

The voltage monitoring circuit 455 may include a MOSFET 505, a MOSFET 510, a comparator circuit 550, and resistors 535, 545, 555, and 565. In one embodiment, the resistors 535 and 545 may function as a first voltage divider, and the resistors 555 and 565 may function as a second voltage divider. Each of the MOSFETs 505 and 510 may include a gate terminal, a drain terminal, and a source terminal. The drain terminal of the FET 505 may be connected to a junction of the emitter terminal of the BJT 440 and the resistor 435. The drain terminal of the FET 510 may be connected to the source terminal of the FET 505, and the source terminal of the FET 510 may be coupled to ground.

Additionally, the comparator circuit 550 may include input terminals 582, 583, 592, and 593, output terminals 581 and 591, a positive supply terminal 572, and a negative supply terminal 574. The gate terminal of the MOSFET 505 may be coupled to the output terminal 581 of the comparator circuit 550, and the gate terminal of the MOSFET 515 may be connected to the output terminal 591 of the comparator circuit 550. The input terminal 582 of the comparator circuit 550 may be connected to the first voltage divider. More specifically, the input terminal 582 may be coupled to a junction of the resistors 535 and 545. Also, the resistor 535 may be coupled to an external supply terminal 533 and the resistor 545 may be connected to ground. The input terminal 593 of the comparator circuit 550 may be connected to the second voltage divider. More specifically, the input terminal 593 may be coupled to a junction of the resistors 555 and 565. Also, the resistor 555 may be coupled to the external supply terminal 533 and the resistor 565 may be connected to ground. Furthermore, the input terminals 583 and 592 may be connected to a reference voltage terminal 577. The positive supply terminal 572 may receive a voltage, e.g., from the internal power supply ($V_1$), and the negative supply terminal 574 may be connected to ground.

It should be noted that the components described with reference to FIG. 5 are meant to be exemplary only, and are not intended to limit the invention to any specific set of components or configurations. For example, in various embodiments, one or more of the components described may be omitted, combined, modified, or additional components included, as desired. For instance, in one embodiment the MOSFETs 405 and 415 may be replaced by other types of isolated-gate FETs (IGFETs) or by other types of transistors such as FETs or BJTs. Also, in some embodiments the number of resistors may vary, e.g., the resistor 535 may represent the combination of two resistors in series.

The output terminal 411 of the protection and voltage monitoring circuit 350 may be connected to a device, e.g., the switching power supply 360 of FIG. 3. The protection and voltage monitoring circuit 350 including the voltage monitoring circuit 455 may be designed to function like a switch and protect the device from an external voltage ($V_{EXT}$) that is outside the allowable range of voltages. In one embodiment, the switching power supply 360 may be configured to receive an external voltage $V_{EXT}$ that is within the range of between 9 and 36 VDC. The comparator circuit 550 of the voltage monitoring circuit 455 may determine whether the external voltage $V_{EXT}$ is within a predetermined voltage range (i.e., the allowable range of voltages). The comparator circuit 550 typically makes this determination based on the voltages received from the first and second voltage dividers, which are connected to $V_{EXT}$, and the reference voltage $V_{REF}$ at the reference voltage terminal 577.

The switch functionality may enable or disable the conduction path between the input terminal 401 and the output terminal 411 of the protection and voltage monitoring circuit 350. If the external voltage $V_{EXT}$ is within the predetermined voltage range, the comparator circuit 550 turns on both MOSFETs 505 and 510, which enables the current source above and turns on the MOSFETs 405 and 415. As a result, a channel of conduction is established between the input terminal 401 and the output terminal 411 of the protection and voltage monitoring circuit 350. If the external voltage $V_{EXT}$ is outside the predetermined voltage range, either the MOSFET 505 or the MOSFET 510 is turned off and the current source is turned off and therefore the switch circuit is disabled, and the device (e.g., the switching power supply 360) connected to the output terminal 411 of the protection and voltage monitoring circuit 350 does not receive the external voltage that is outside of the predetermined voltage range. In other words, if the external voltage $V_{EXT}$ is outside the predetermined voltage range the protection and voltage monitoring circuit 350 is disabled to block the external voltage $V_{EXT}$ from the output terminal 411. In one embodiment, when the external voltage $V_{EXT}$ is outside of the predetermined voltage range an error condition is reported to the system, e.g., the measurement system 101 of FIG. 1. It is noted that the external voltage $V_{EXT}$ may be any voltage received from outside the protection and voltage monitoring circuit 350, e.g., the external voltage $V_{EXT}$ received by the measurement module 250 of FIG. 3 via the I/O connector 340. It is also noted that protection and voltage monitoring circuit 350 may be connected to other devices instead of or in addition to the switching power supply 360.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A protection circuit comprising:
   an output terminal;
   an input terminal operable to receive an external voltage;
   a first transistor including a gate terminal, a drain terminal, and a source terminal, wherein the drain terminal of the first transistor is coupled to the input terminal of the protection circuit;
   a second transistor including a gate terminal, a drain terminal, and a source terminal, wherein the drain terminal of the second transistor is coupled to the output terminal of the protection circuit, the gate terminal of the second transistor is coupled to the gate terminal of the first transistor, and the source terminal of the second transistor is coupled to the source terminal of the first transistor;
   a first resistor coupled between a junction of the source terminals of the first and second transistors and a junction of the gate terminals of the first and second transistors;
   a current source coupled to the junction of the gate terminals of the first and second transistors and to the first resistor to limit a gate-to-source voltage of the first and second transistors to a predetermined voltage value that is less than a maximum allowed voltage value; and
   a voltage monitoring circuit coupled to the current source, wherein the voltage monitoring circuit includes:
      a third transistor including a gate terminal, a drain terminal, and a source terminal, wherein the drain terminal of the third transistor is coupled to the current source;
      a fourth transistor including a gate terminal, a drain terminal, and a source terminal, wherein the drain terminal of the fourth transistor is coupled to the source terminal of the third transistor, wherein the source terminal of the fourth transistor is coupled to ground; and
      a comparator circuit coupled to the gate terminal of the third and fourth transistors, wherein the comparator circuit is operable to determine whether the external voltage is within a predetermined voltage range.

2. The protection circuit of claim 1, wherein the first and second transistors are metal-oxide semiconductor field-effect transistors (MOSFETs).

3. The protection circuit of claim 1, wherein the current source includes:
   a first bipolar junction transistor (BJT) including a base terminal, an emitter terminal, and a collector terminal, wherein the collector terminal of the first BJT is coupled to the junction of the gate terminals of the first and second transistors and to the first resistor; and
   a second BJT including a base terminal, an emitter terminal, and a collector terminal, wherein the collector terminal of the second BJT is coupled to a junction of the base terminal of the first BJT and a second resistor, wherein the second resistor is coupled to a power supply terminal, wherein the base terminal of the second BJT is coupled to a junction of the emitter terminal of the first BJT and a third resistor, and wherein the emitter terminal of the second BJT is coupled to the third resistor.

4. The protection circuit of claim 1, wherein the current source is operable to limit the gate-to-source voltage of the first and second transistors to a predetermined voltage value that is less than the maximum allowed voltage value by controlling a current flow through the first resistor.

5. The protection circuit of claim 4, wherein the predetermined voltage value is eleven volts and the maximum allowed voltage value is twenty volts.

6. The protection circuit of claim 3, further comprising a diode coupled between the current source and the junction of the gate terminals of the first and second transistors and the first resistor.

7. The protection circuit of claim 1, wherein, in response to the external voltage being within the predetermined voltage range, the voltage monitoring circuit is operable to turn on the third and fourth transistors, turn on the current source, and turn on the first and second transistors to establish a conduction path between the input terminal and the output terminal of the protection circuit.

8. The protection circuit of claim 1, wherein, in response to the external voltage being outside the predetermined voltage range, the voltage monitoring circuit is operable to turn off either the third or the fourth transistor and turn off the current source to block the external voltage from the output terminal of the protection circuit.

9. The protection circuit of claim 1, wherein the third and fourth transistors are metal-oxide semiconductor field-effect transistors (MOSFETs).

10. The protection circuit of claim 1, wherein the voltage monitoring circuit further includes a first voltage divider and a second voltage divider coupled to receive the external voltage, and the comparator circuit includes a first input terminal, a second input terminal, a first output terminal, and a second output terminal, wherein the first voltage divider is coupled to the first input terminal of the comparator circuit and the second voltage divider is coupled to the second input terminal of the comparator circuit, and wherein the gate terminal of the third transistor is coupled to the first output terminal of the comparator circuit and the gate terminal of the fourth transistor is coupled to the second output terminal of the comparator circuit.

11. A measurement device comprising:
    a power supply; and
    a protection circuit including:
       an input terminal operable to receive an external voltage;
       an output terminal coupled to the power supply;
       a first transistor including a gate terminal, a drain terminal, and a source terminal, wherein the drain terminal of the first transistor is coupled to the input terminal of the protection circuit;
       a second transistor including a gate terminal, a drain terminal, and a source terminal, wherein the drain terminal of the second transistor is coupled to the output terminal of the protection circuit, the gate terminal of the second transistor is coupled to the gate terminal of the first transistor, and the source terminal of the second transistor is coupled to the source terminal of the first transistor;
       a first resistor coupled between a junction of the source terminals of the first and second transistors and a junction of the gate terminals of the first and second transistors;
       a current source coupled to the junction of the gate terminals of the first and second transistors and to the first resistor to limit a gate-to-source voltage of the first and second transistors to a predetermined voltage value that is less than a maximum allowed voltage value; and
       a voltage monitoring circuit coupled to the current source, wherein the voltage monitoring circuit includes:
          a third transistor including a gate terminal, a drain terminal, and a source terminal, wherein the drain terminal of the third transistor is coupled to the current source;

a fourth transistor including a gate terminal, a drain terminal, and a source terminal, wherein the drain terminal of the fourth transistor is coupled to the source terminal of the third transistor, wherein the source terminal of the fourth transistor is coupled to ground; and a comparator circuit coupled to the gate terminal of the third and fourth transistors, wherein the comparator circuit is operable to determine whether the external voltage is within a predetermined voltage range.

12. The measurement device of claim 11, wherein the first and second transistors are metal-oxide semiconductor field-effect transistors (MOSFETs).

13. The measurement device of claim 11, wherein the current source includes:

a first bipolar junction transistor (BJT) including a base terminal, an emitter terminal, and a collector terminal, wherein the collector terminal of the first BJT is coupled to the junction of the gate terminals of the first and second transistors and to the first resistor; and a second BJT including a base terminal, an emitter terminal, and a collector terminal, wherein the collector terminal of the second BJT is coupled to a junction of the base terminal of the first BJT and a second resistor, wherein the second resistor is coupled to a power supply terminal, wherein the base terminal of the second BJT is coupled to a junction of the emitter terminal of the first BJT and a third resistor, and wherein the emitter terminal of the second BJT is coupled to the third resistor.

14. The measurement device of claim 11, wherein the current source is operable to limit the gate-to-source voltage of the first and second transistors to a predetermined voltage value that is less than the maximum allowed voltage value by controlling a current flow through the first resistor.

15. The measurement device of claim 11, comprised in a reconfigurable input/output (RIO) module.

16. The measurement device of claim 13, further comprising a diode coupled between the current source and the junction of the gate terminals of the first and second transistors and the first resistor.

17. The measurement device of claim 11, wherein, in response to the external voltage being within the predetermined voltage range, the voltage monitoring circuit is operable to turn on the third and fourth transistors, turn on the current source, and turn on the first and second transistors to establish a conduction path between the input terminal and the output terminal of the protection circuit.

18. The measurement device of claim 11, wherein in response to the external voltage being outside the predetermined voltage range the voltage monitoring circuit is operable to turn off either the third or the fourth transistor and turn off the current source to block the external voltage from the output terminal of the protection circuit to prevent damage to the power supply.

19. The measurement device of claim 11, wherein the third and fourth transistors are metal-oxide semiconductor field-effect transistors (MOSFETs).

20. The measurement device of claim 11, wherein the voltage monitoring circuit further includes a first voltage divider and a second voltage divider coupled to receive the external voltage, and the comparator circuit includes a first input terminal, a second input terminal, a first output terminal, and a second output terminal, wherein the first voltage divider is coupled to the first input terminal of the comparator circuit and the second voltage divider is coupled to the second input terminal of the comparator circuit, and wherein the gate terminal of the third transistor is coupled to the first output terminal of the comparator circuit and the gate terminal of the fourth transistor is coupled to the second output terminal of the comparator circuit.

21. The measurement device of claim 11, comprised in a measurement system including a computer system and a unit under test (UUT), wherein the measurement device is operable to receive a digital signal from the computer system and to provide an analog signal to the UUT to stimulate the UUT.

22. A protection circuit comprising:

an output terminal;

an input terminal operable to receive an external voltage;

a first MOSFET including a gate terminal, a drain terminal, and a source terminal, wherein the drain terminal of the first MOSFET is coupled to the input terminal of the protection circuit;

a second MOSFET including a gate terminal, a drain terminal, and a source terminal, wherein the drain terminal of the second MOSFET is coupled to the output terminal of the protection circuit, the gate terminal of the second MOSFET is coupled to the gate terminal of the first MOSFET, and the source terminal of the second MOSFET is coupled to the source terminal of the first MOSFET;

a first resistor coupled between a junction of the source terminals of the first and second MOSFETs and a junction of the gate terminals of the first and second MOSFETs;

a current source coupled to the junction of the gate terminals of the first and second MOSFETs and to the first resistor, wherein the current source is operable to limit a gate-to-source voltage of the first and second MOSFETs to a predetermined voltage value that is less than a maximum allowed voltage value, wherein the current source includes:

a first bipolar junction transistor (BJT) including a base terminal, an emitter terminal, and a collector terminal, wherein the collector terminal of the first BJT is coupled to the junction of the gate terminals of the first and second MOSFETs and to the first resistor; and a second BJT including a base terminal, an emitter terminal, and a collector terminal, wherein the collector terminal of the second BJT is coupled to a junction of the base terminal of the first BJT and a second resistor, wherein the second resistor is coupled to a power supply terminal, wherein the base terminal of the second BJT is coupled to a junction of the emitter terminal of the first BJT and a third resistor, and wherein the emitter terminal of the second BJT is coupled to the third resistor; and a voltage monitoring circuit coupled to the current source, wherein the voltage monitoring circuit includes:

a third MOSFET including a gate terminal, a drain terminal, and a source terminal, wherein the drain terminal of the third MOSFET is coupled to a junction of the emitter terminal of the second BJT and the third resistor;

a fourth MOSFET including a gate terminal, a drain terminal, and a source terminal, wherein the drain terminal of the fourth MOSFET is coupled to the source terminal of the third MOSFET, wherein the source terminal of the fourth MOSFET is coupled to ground; and a comparator circuit coupled to the gate terminal of the third and fourth MOSFETs, wherein the comparator circuit is operable to determine whether the external voltage is within a predetermined voltage range.

23. A measurement device comprising:

a power supply; and a protection circuit including:

an input terminal operable to receive an external voltage;

an output terminal coupled to the power supply;

a first MOSFET including a gate terminal, a drain terminal, and a source terminal, wherein the drain terminal of the first MOSFET is coupled to the input terminal of the protection circuit;

a second MOSFET including a gate terminal, a drain terminal, and a source terminal, wherein the drain terminal of the second MOSFET is coupled to the output terminal of the protection circuit, the gate terminal of the second MOSFET is coupled to the gate terminal of the first MOSFET, and the source terminal of the second MOSFET is coupled to the source terminal of the first MOSFET;

a first resistor coupled between a junction of the source terminals of the first and second MOSFETs and a junction of the gate terminals of the first and second MOSFETs;

a current source coupled to the junction of the gate terminals of the first and second MOSFETs and to the first resistor, wherein the current source is operable to limit a gate-to-source voltage of the first and second MOSFETs to a predetermined voltage value that is less than a maximum allowed voltage value, wherein the current source includes:

a first bipolar junction transistor (BJT) including a base terminal, an emitter terminal, and a collector terminal, wherein the collector terminal of the first BJT is coupled to the junction of the gate terminals of the first and second MOSFETs and to the first resistor; and a second BJT including a base terminal, an emitter terminal, and a collector terminal, wherein the collector terminal of the second BJT is coupled to a junction of the base terminal of the first BJT and a second resistor, wherein the second resistor is coupled to a power supply terminal, wherein the base terminal of the second BJT is coupled to a junction of the emitter terminal of the first BJT and a third resistor, and wherein the emitter terminal of the second BJT is coupled to the third resistor; and a voltage monitoring circuit coupled to the current source, wherein the voltage monitoring circuit includes:

a third MOSFET including a gate terminal, a drain terminal, and a source terminal, wherein the drain terminal of the third MOSFET is coupled to a junction of the emitter terminal of the second BJT and the third resistor;

a fourth MOSFET including a gate terminal, a drain terminal, and a source terminal, wherein the drain terminal of the fourth MOSFET is coupled to the source terminal of the third MOSFET, wherein the source terminal of the fourth MOSFET is coupled to ground; and a comparator circuit coupled to the gate terminal of the third and fourth MOSFETs, wherein the comparator circuit is operable to determine whether the external voltage is within a predetermined voltage range.

* * * * *